United States Patent [19]

Nadler et al.

[11] Patent Number: 4,729,614

[45] Date of Patent: Mar. 8, 1988

[54] ELECTRONICS CABINET SECURITY COVER

[75] Inventors: Richard Nadler, Brighton; Joseph F. Sadlow, North Reading, both of Mass.

[73] Assignee: Secure Technologies, Inc., Dedham, Mass.

[21] Appl. No.: 902,486

[22] Filed: Sep. 2, 1986

[51] Int. Cl.[4] .............................................. A47B 81/00
[52] U.S. Cl. ....................................... 312/292; 70/83; 109/49.5; 312/310
[58] Field of Search ............... 312/291, 292, 310, 295; 70/83, 84, 78, 158, 159, 162, DIG. 19; 109/49.5, 68

[56] References Cited

U.S. PATENT DOCUMENTS

| | | | |
|---|---|---|---|
| 2,493,947 | 1/1950 | Danninger | 312/291 X |
| 3,741,619 | 6/1973 | Dyer | 312/291 X |
| 4,175,672 | 11/1979 | Moser | 312/292 |
| 4,363,528 | 12/1982 | Olashaw | 312/292 |

Primary Examiner—James T. McCall

[57] ABSTRACT

A cover for a cabinet of the kind having an exposed portion to which access is to be controlled in which the cover has a panel to be attached to the cabinet; the panel has an opening corresponding to the exposed portion; a movable door is arranged to obstruct access to the exposed portion when the door is in a first location, and to permit access to the portion through the opening when the door is in a second location; and a locking mechanism is provided both for locking the panel to the cabinet and for locking the door in the first location. In another aspect, there are a plurality of doors arranged to obstruct access to the exposed portions; the cover has a first state in which a locking mechanism locks only one door in a first location and another state in which the locking mechanism locks at least another door. In another aspect, the doors, when not obstructing access via openings in the panel, lie in parallel planes adjacent to the panel in an area spaced away from the opening.

21 Claims, 12 Drawing Figures

ELECTRONICS CABINET SECURITY COVER

BACKGROUND OF THE INVENTION

This invention relates to covers for electronics cabinets.

Typically exposed on one side of such a cabinet are switches, disk drives, and other devices to which access must be controlled and which need to be protected from tampering and theft, while remaining accessible to authorized people.

SUMMARY OF THE INVENTION

One general feature of the invention is a cover for a cabinet of the kind having an exposed portion to which access is to be controlled; the cover has a panel to be attached to the cabinet; the panel has an opening corresponding to the exposed portion; a movable door is arranged to obstruct access to the exposed portion when the door is in a first location, and to permit access to the portion when the door is in a second location; and a locking mechanism is provided both for locking the panel to the cabinet and for locking the door in the first location.

Another general feature of the invention is a cabinet cover having a plurality of movable doors each door being arranged to obstruct access to one of a plurality of exposed portions when the door is in a first location and to permit access to said one of the exposed portions when the door is in a second location, and a locking mechanism for locking each of the doors in either the first or the second location, such that, when the locking mechanism is locked, the cover has two possible states such that in one state only one of the doors is locked in its first location and in the second state at least another door is locked in its first location.

Another general feature of the invention is a cabinet cover in which a plurality of movable doors are arranged to obstruct access to an exposed portion when the doors are in a first location and to permit access to said portion when the doors are in a second location, and when in the second location to lie in parallel planes adjacent to the panel in an area spaced away from the opening.

Preferred embodiments include the following features. The locking mechanism is arranged to lock the doors in the second location. There are a plurality of exposed portions, a plurality of openings in the panel, and a plurality of doors associated respectively with the exposed portions, and when the cover is in its second state, all of the doors are locked in the first location. When the locking mechanism is locked, the cover has two selectable states, one state in which the panel is locked to the cabinet and a second state in which the panel is locked to the cabinet and at least one door is locked in the first location. In the first state the door is locked in the second location. The exposed portion is on one side of the cabinet, and the panel is generally planar. Each door has a transparent window, and moves by sliding. The locking mechanism is a key-operated mechanical rotary lock. In some embodiments, there are three doors each having a first location and a second location, and when the cover is in one state, only one of the doors is in its first location, and in the second state at least the other two doors are locked in the first location. When the cover is in the first or the second state, the doors not locked in the first location are locked in the second location. The doors are arranged side-by-side in the first location and slide with respect to one another to reach the second location. The three doors are arranged in three quadrants of a rectangle and the area where the doors lie in the second location is the fourth quadrant of the rectangle.

Simple, easy to control access to different portions of the cabinet is provided using an easy-to-secure panel. The protected areas are easily seen even when the doors are locked. The doors are hidden when opened to provide unobstructed access. A single key controls all functions.

Other advantages and features will become apparent from the following description of the preferred embodiment, and from the claims.

DESCRIPTION OF THE PREFERRED EMBODIMENT

We first briefly describe the drawings.

Drawings

Structure and Operation

Figure 1:
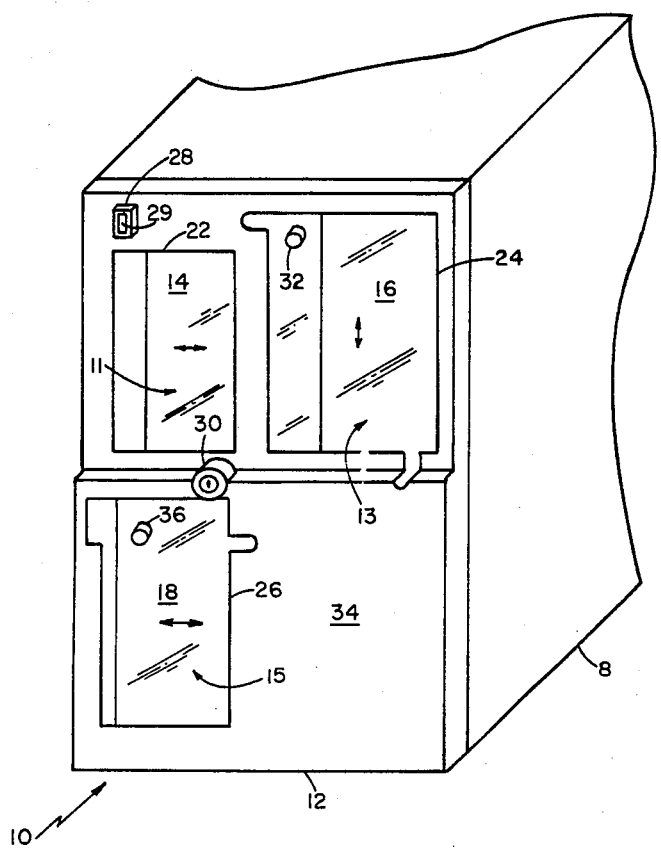
FIG. 1 is a perspective view of a cabinet and cover.

Referring to FIG. 1, one side of a Digital Equipment Corporation microVAX electronics cabinet 8 includes three bays 11, 13, 15 that normally permit access to disk drives, tape units, and various switches (e.g., restart/run and halt) mounted inside cabinet 8. Attached to cabinet 8 is a security cover 10 which includes a steel panel 12, three access openings 22, 24, 26, and three slidable transparent Lexan windows (which may also be thought of as doors) 14, 16, 18 for preventing access to the interior of cabinet 8 via openings 22, 24, 26, respectively. An additional opening 28 in cover 10 provides access to an ON/OFF power switch.

A key-operated, dual-position lock 30 controls the opening and closing of windows 14, 16, 18 and also locks cover 10 to cabinet 8. In a first, unlocked position cover 10 can be removed from cabinet 8 and the windows 14, 16, 18 can be freely opened and closed; windows 14, 16 are opened by grasping a handle 32 attached to window 14 and sliding window 14 to the right until handle 32 reaches the right edge of opening 24; at this point both window 14 and underlying window 16 may be lowered, by handle 32, behind a rectangular section 34 of panel 12. Window 18 is opened by grasping a handle 36 (attached to window 18) and sliding the window to the right behind section 34. The lower half of panel 12, which includes section 34, is deeper than the upper half in order to accommodate all three windows 14, 16, 18 behind section 34.

When lock 30 is rotated to the second, locked position, cover 10 is locked to cabinet 8 and windows 14, 16, 18 are locked in one of four possible states (the locked state being the same as the state occupied when lock 30 is rotated to its second position): in a first state, windows 18, 16, 14 are locked closed; in a second state window 18 is locked closed and windows 14, 16 are locked open; in a third state windows 14, 16 are locked closed, and window 18 is locked open; and, in a fourth state all of the windows are locked open. The key to lock 30 can be removed only when the lock is in the second position thus assuring that cover 10 is locked to cabinet 8 when the key is removed.

Figure 2:
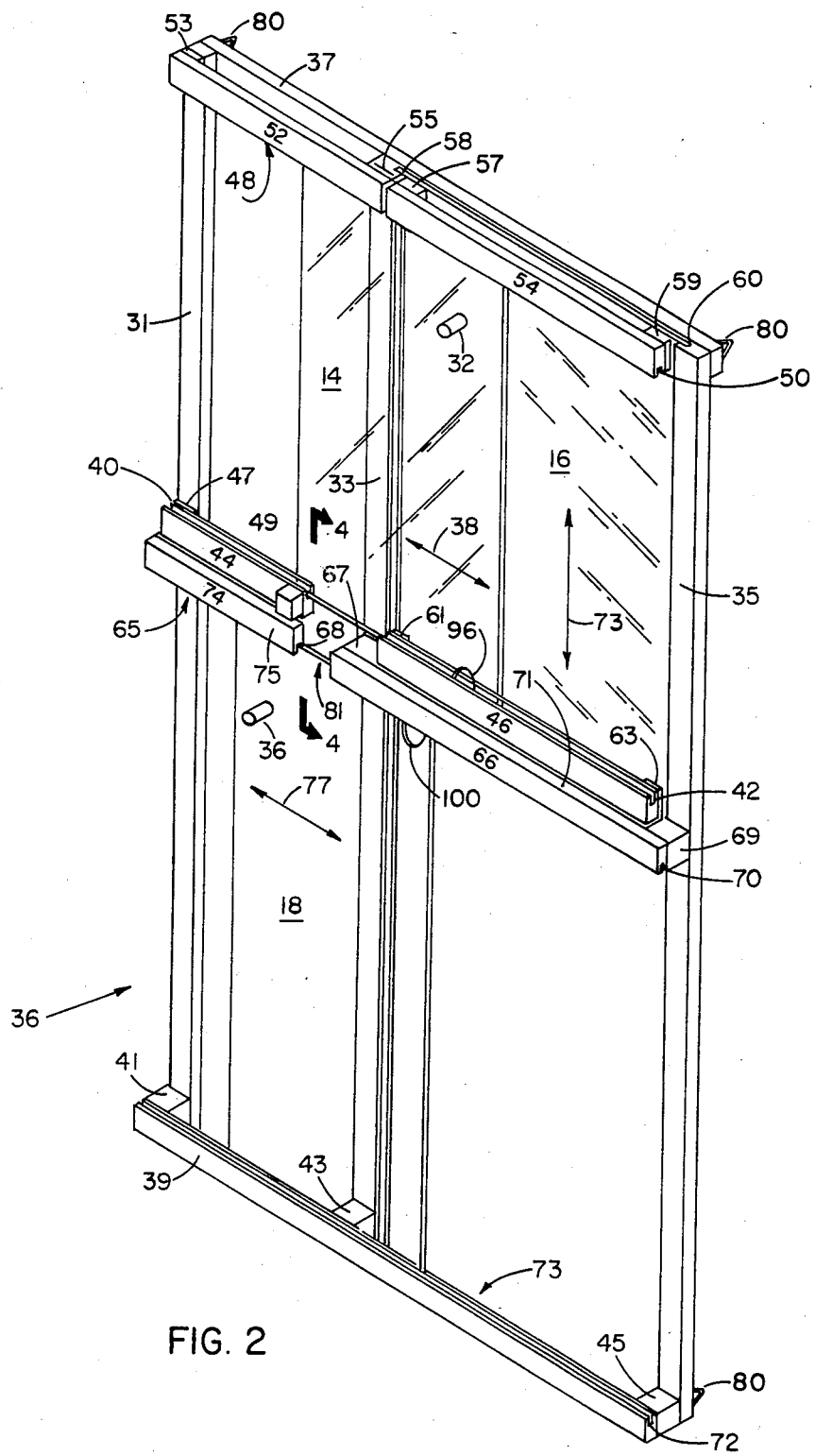
FIG. 2 is a perspective view of the internal parts of the cover of FIG. 1.

Referring to FIG. 2, behind panel 12 FIG. 1 cover 10 includes a frame 36 for holding and permitting operation of the windows and lock. Frame 36 includes three vertical bars 31, 33, 35 connected to two horizontal bars 37, 39. Spacers 41, 43, 45 both connect bar 39 to and space it apart from bars 31, 33, 35.

To support window 14, a horizontal bar 52 is attached to bars 31, 33 at the top of frame 36 using spacers 53, 55; a parallel horizontal bar 44 is attached to bar 31 using spacer 47 and is also attached to panel 12 (FIG. 1) using a spacer 49. To support window 14 when in the fully open location, parallel bars 54, 46 are similarly attached directly to window 16 via spacers 57, 59, 61, 63.

Window 18 is supported by bar 39 and by horizontal bars 74, 66 which are attached to bars 31, 33, 35 at the middle of frame 36 using spacers 65, 67, 69, respectively. Bar 74 is also attached to panel 12 (FIG. 1) at location 75. Spacers 67, 69 are sufficiently deep to permit window 16 and attached bars 54, 46 to move freely through a channel 71 behind bar 66. Bar 39 is spaced away from bars 31, 33, 35 sufficiently to permit window 16 and bar 46 to move freely into a channel 73 behind bar 39.

Window 14, when unlocked, slides left and right (arrows 38) in colinear grooves 40, 42 in bars 44, 46 and colinear grooves 48, 50 in bars 52, 54.

As window 14 reaches the right edge of frame 36 it passes completely from grooves 40, 48 into grooves 42, 50.

Only when window 14 reaches that point are window 16, together with window 14 (held in grooves 42, 50), free to slide up and down (arrows 73) in grooves 58, 60 of vertical bars 33, 35.

Independently of windows 14, 16, window 18, when unlocked, slides left and right (arrows 77) in grooves 68, 70, 72 in bars 74, 66, 39, respectively. Bars 74, 66, 39 are spaced away from bars 31, 33, 35 far enough so that windows 14, 16 fit behind window 18 when all three windows are open and occupy the rectangular space delineated by members 33, 35, 39, 66 corresponding to section 34 of panel 12 (FIG. 1).

Conventional push-to-fit connector prongs 80, at the four rear corners of frame 36, are pressed into receiving holes in cabinet 8 to support cover 10. In the bottom right edge of window 14, and in the top right edge of window 18 are slots 96, 100, respectively, which mate with the parts of a lock cam to be described below. A space 81 is provided between the ends of bars 66, 74, and 44, 46 to accommodate the lock and cam.

Figure 3:
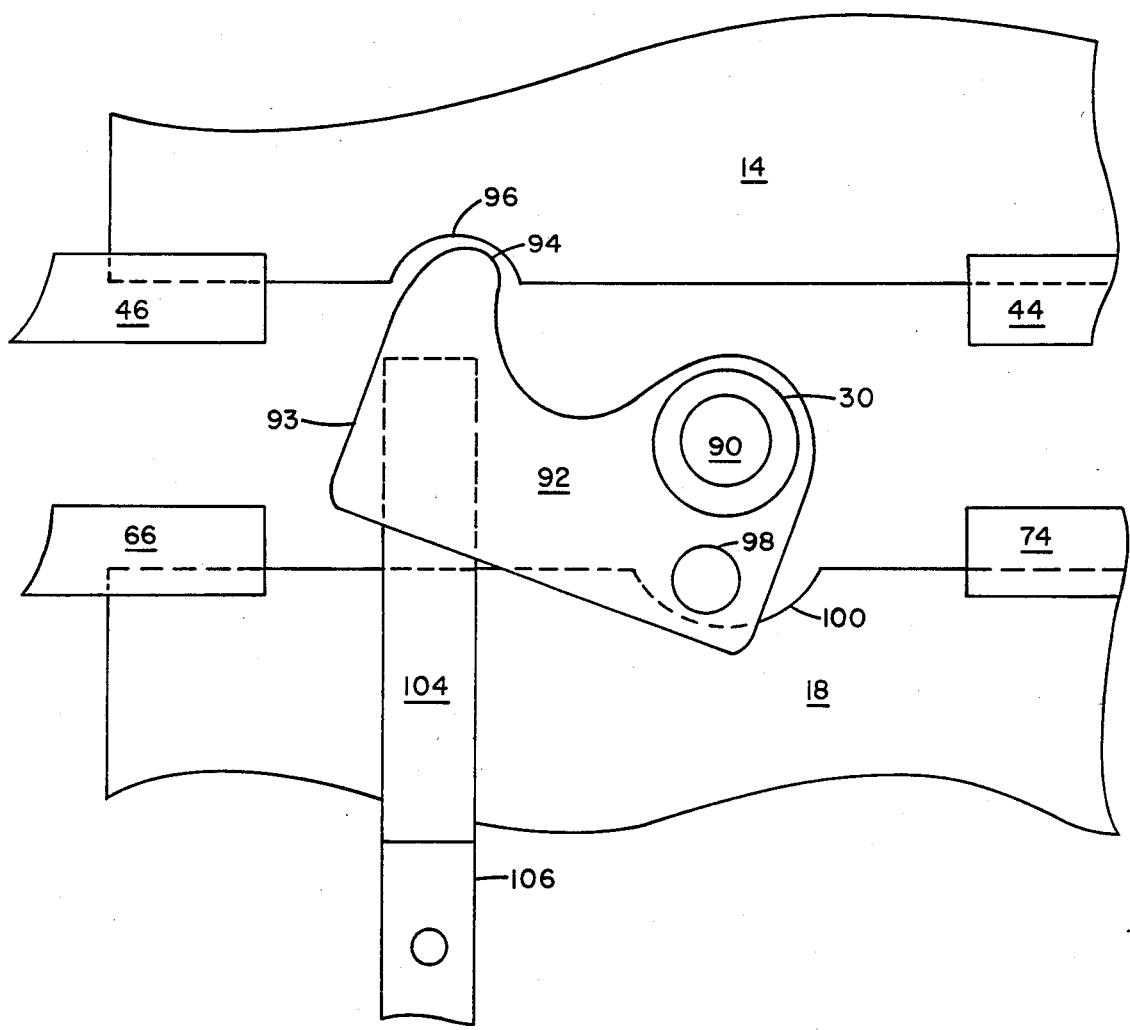
FIGS. 3, 4 are a rear view and a sectional side view (at 4—4 in FIG. 2), respectively, of the locking mechanism of the cover in a position with the cover in a first state.
Figure 4:
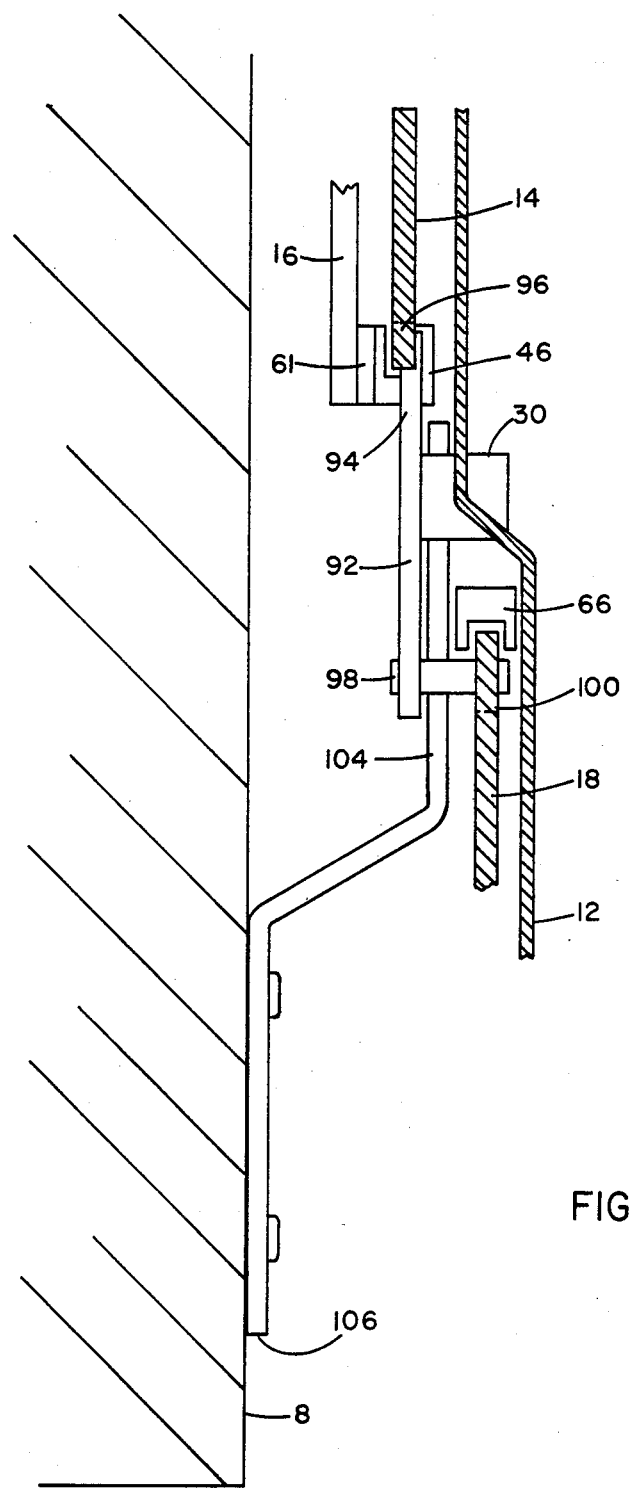

Referring to FIGS. 3, 4, lock 30 includes a shaft 90 and a cam 92 which rotate when a key is inserted in the lock and turned. Cam 92 (shown here with lock 30 in the second position with all windows locked in their closed locations and cover 10 locked to cabinet 8, i.e. in the first state) includes a finger 94 which extends into slot 96 of window 14, preventing it from sliding. Cam 92 also includes a pin 98 which extends into slot 100 in the top of window 18, also preventing it from sliding.

Cam piece 92 also has an arm 93 that fits between the upper end 104 of a bracket 106 (whose lower end is screwed to cabinet 8) and cabinet 8, thus securing cover 10 to the cabinet.

Figure 5:
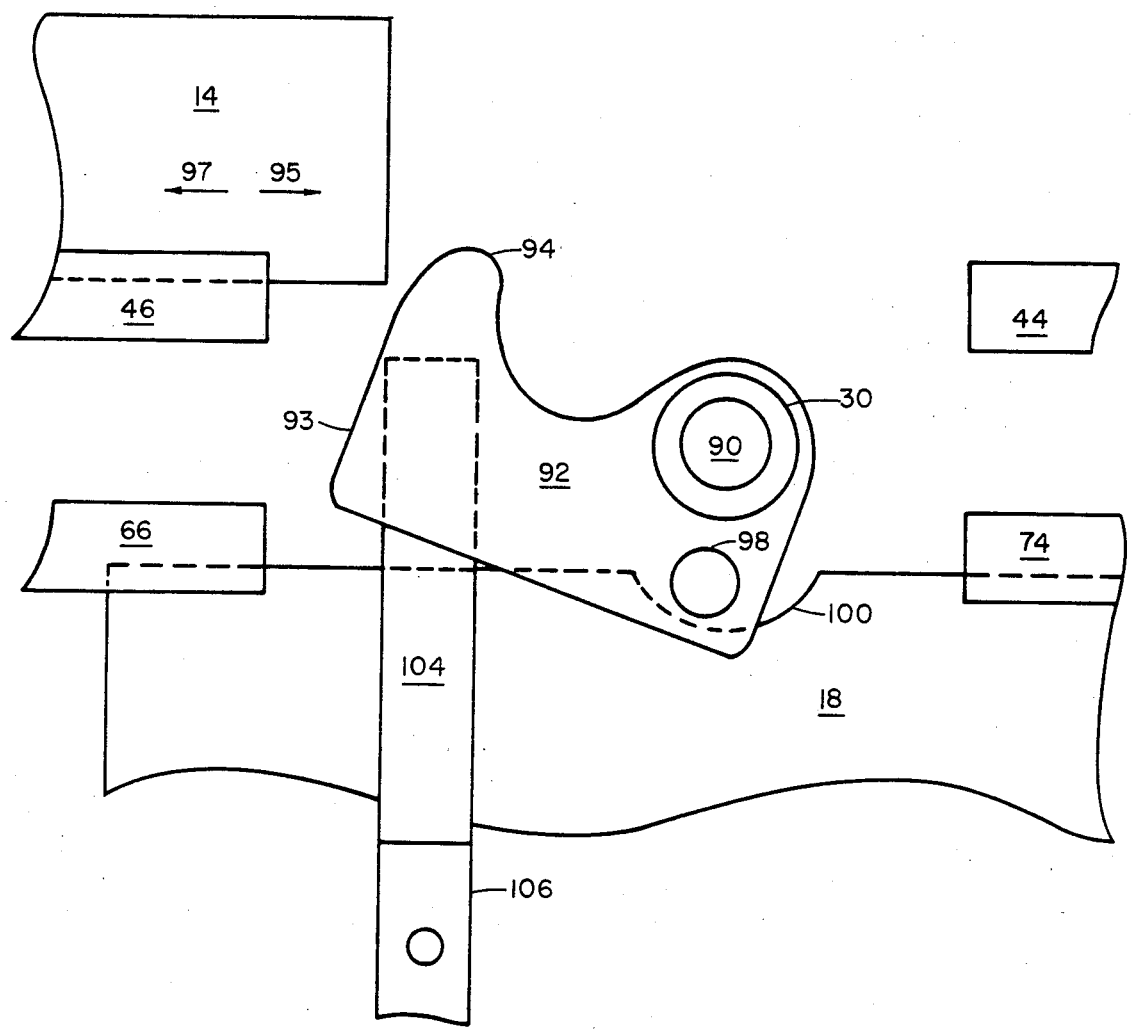
FIGS. 5, 6, 7 are rear views like FIG. 3, but with the cover in second, third, and fourth states, respectively.

Referring to FIG. 5, when cover 10 is in the second state (with lock 30 in the second position) window 14 is open and is prevented from being slid closed (in the direction of arrow 95) by finger 94; pin 98 remains in slot 100, continuing to prevent window 18 from being opened, and arm 93 continues to lock cover 10 to cabinet 8.

While window 14 cannot be slid closed in the direction of arrow 95 it can be slid further open (in the direction of arrow 97) until handle 32 reaches the right edge of opening 24 at which point window 14 and window 16 may be lowered, together, behind section 34 (FIG. 1).

Figure 6:
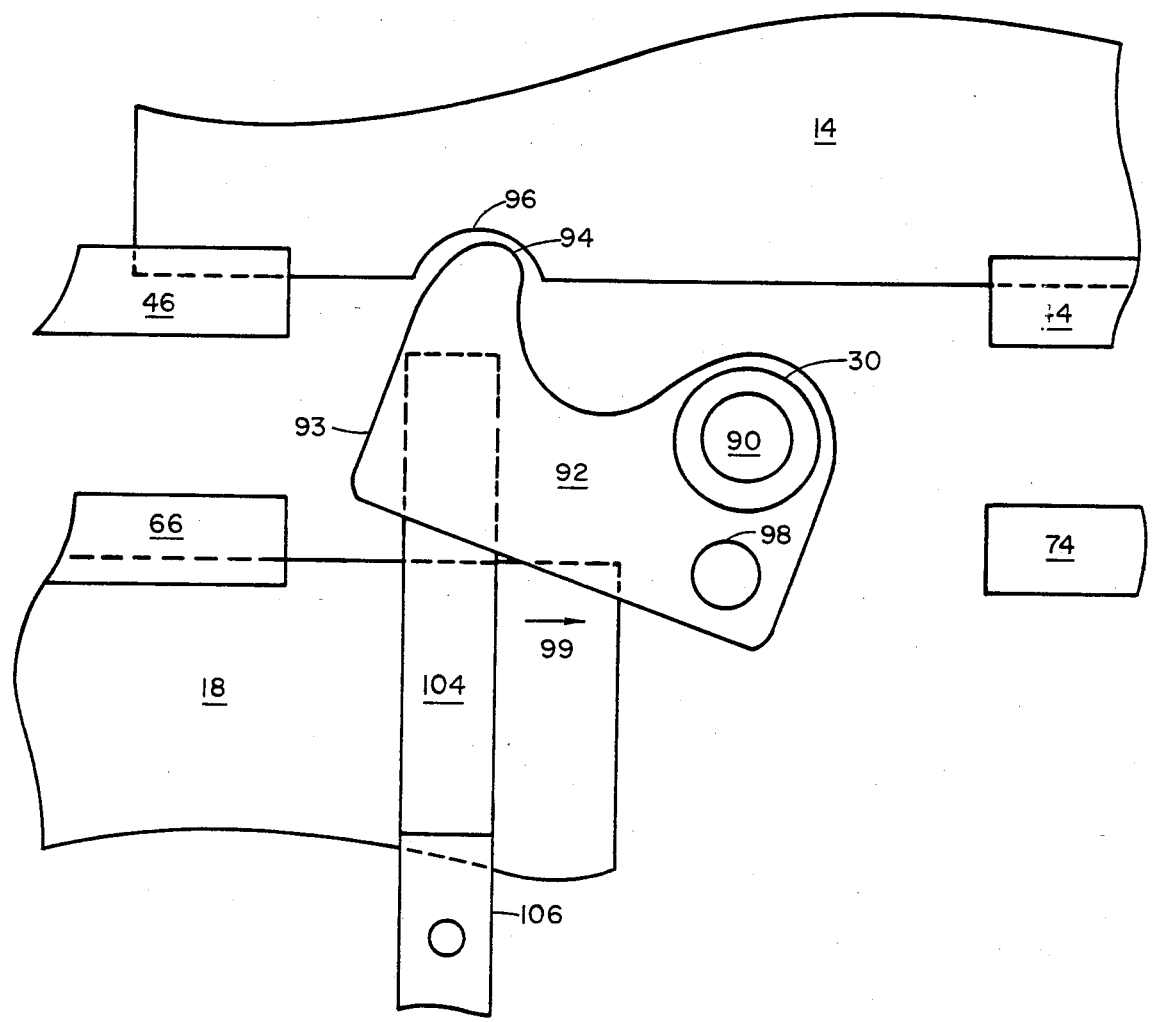

Referring to FIG. 6, when cover 10 is in the third state (again, with lock 30 in the second position) window 18 is open and is prevented from being slid closed (in the direction of arrow 99) by pin 98; finger 94 is in slot 96 of window 14, locking it closed, and arm 93 is between upper end 104 of bracket 106 and cabinet 8, thus continuing to lock cover 10 to the cabinet.

Figure 7:
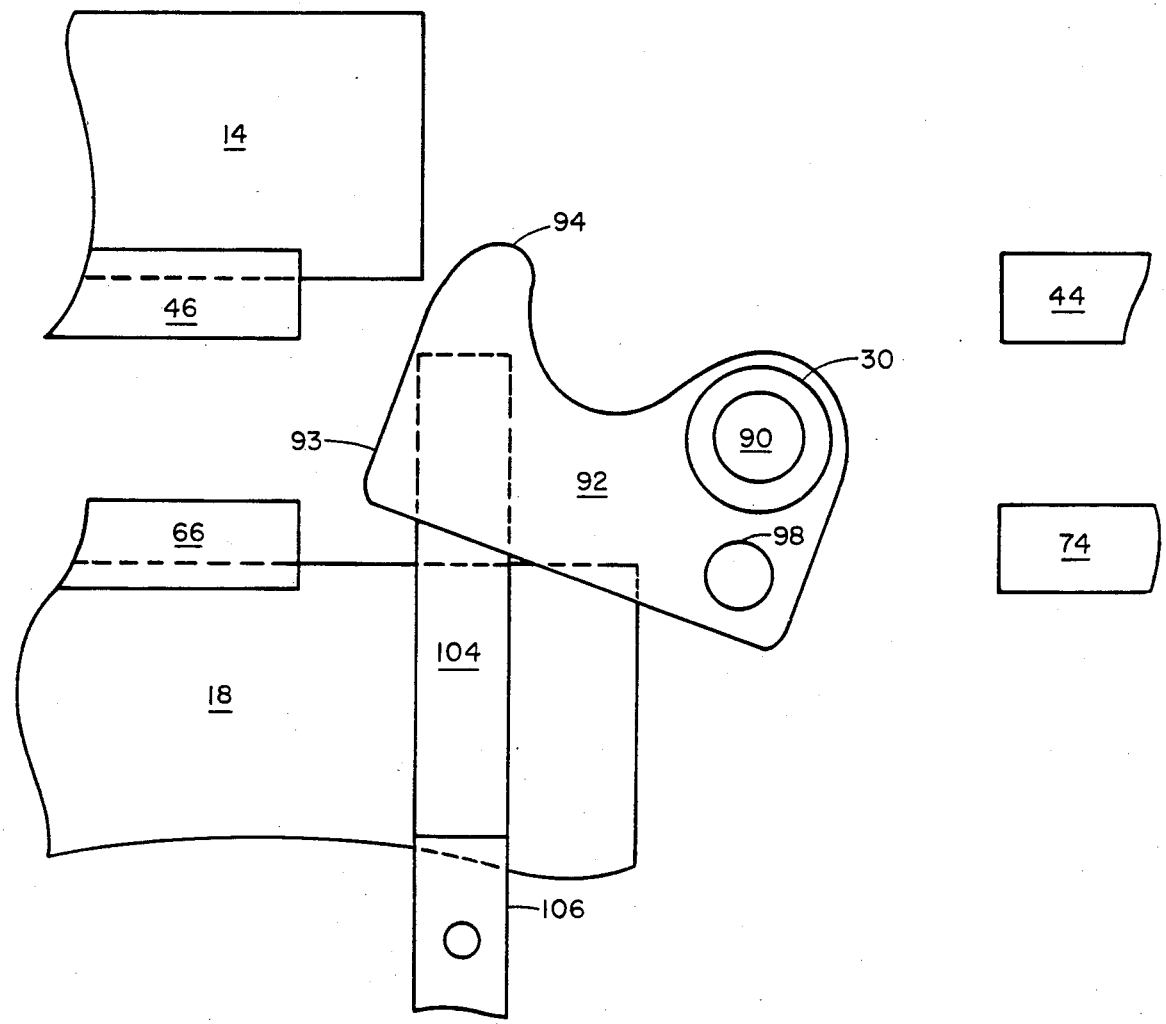

Referring to FIG. 7, when cover 10 is in the fourth state (with lock 30 in the second position) windows 14, 18 are open (and window 16 can be open or closed, as described above) and are prevented from being slid closed by finger 94 and pin 98 respectively.

Figure 8:
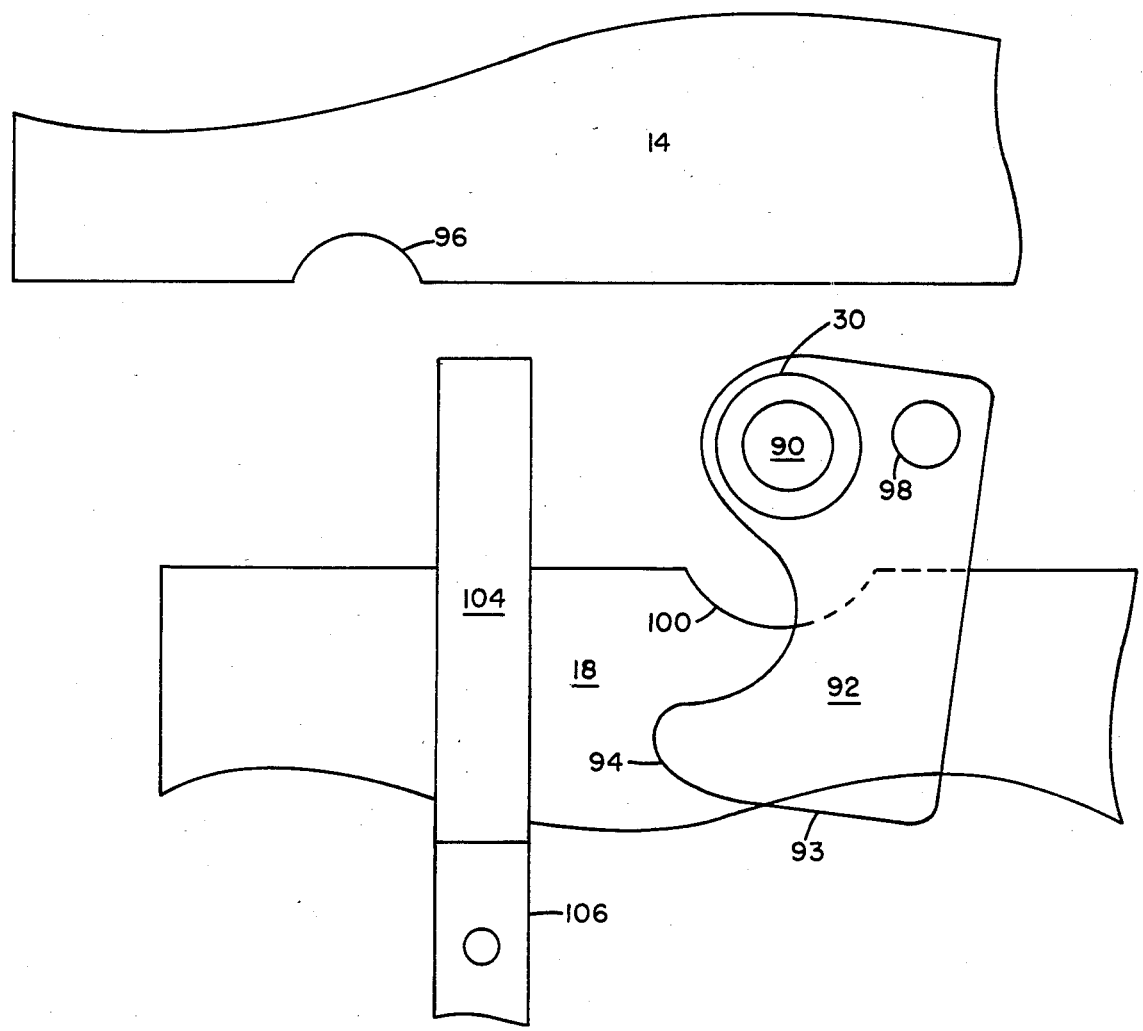
FIG. 8 is a rear view like FIG. 3, but with the locking mechanism in a first position.

Referring to FIG. 8, when cam 92 is in the first position, finger 94 no longer cooperates with end 104 to lock cover 10 to cabinet 8 and all windows are free to slide.

Other embodiments are within tne following claims.

Figure 9:
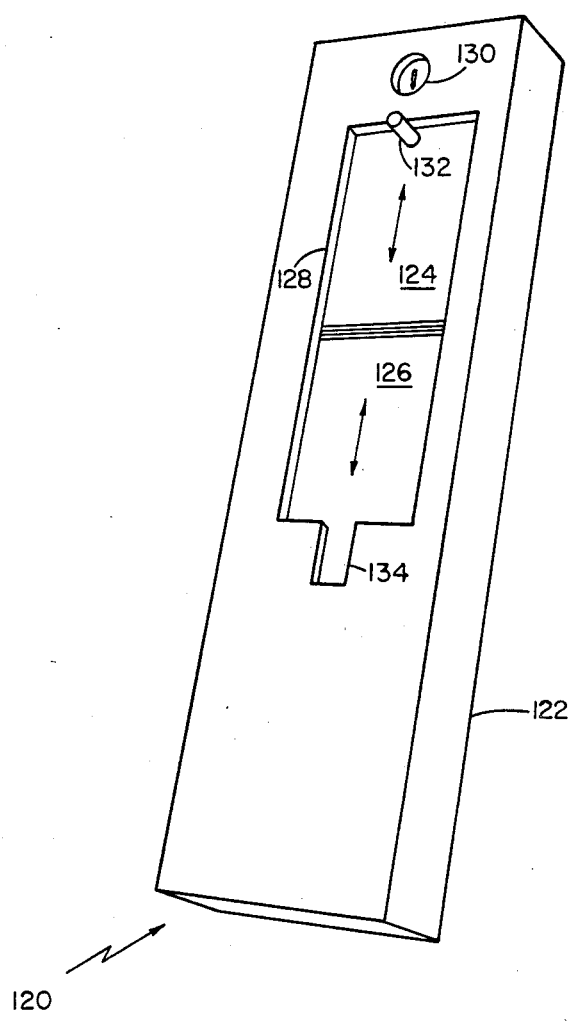
FIG. 9 is a view of another embodiment.

For example, referring to FIG. 9, another cabinet cover 120 includes a panel 122, two windows 124, 126 for preventing access to the cabinet (not shown) via opening 128, and a lock 130.

In a first, unlocked position lock 130 can be removed from the cabinet and the windows 124, 126 can be freely opened and closed; the windows can be opened by grasping handle 132 and sliding window 124 downward over window 126 and then sliding both windows 124, 126 downward together. The windows continue to slide downward together until handle 132 reaches the bottom of notch 134 in panel 122, both windows then being hidden behind the bottom part of panel 122.

When lock 130 is in a second, locked position cover 120 is locked to the cabinet and windows 124, 126 are locked in either a first, closed state or a second, open state.

Figure 10:
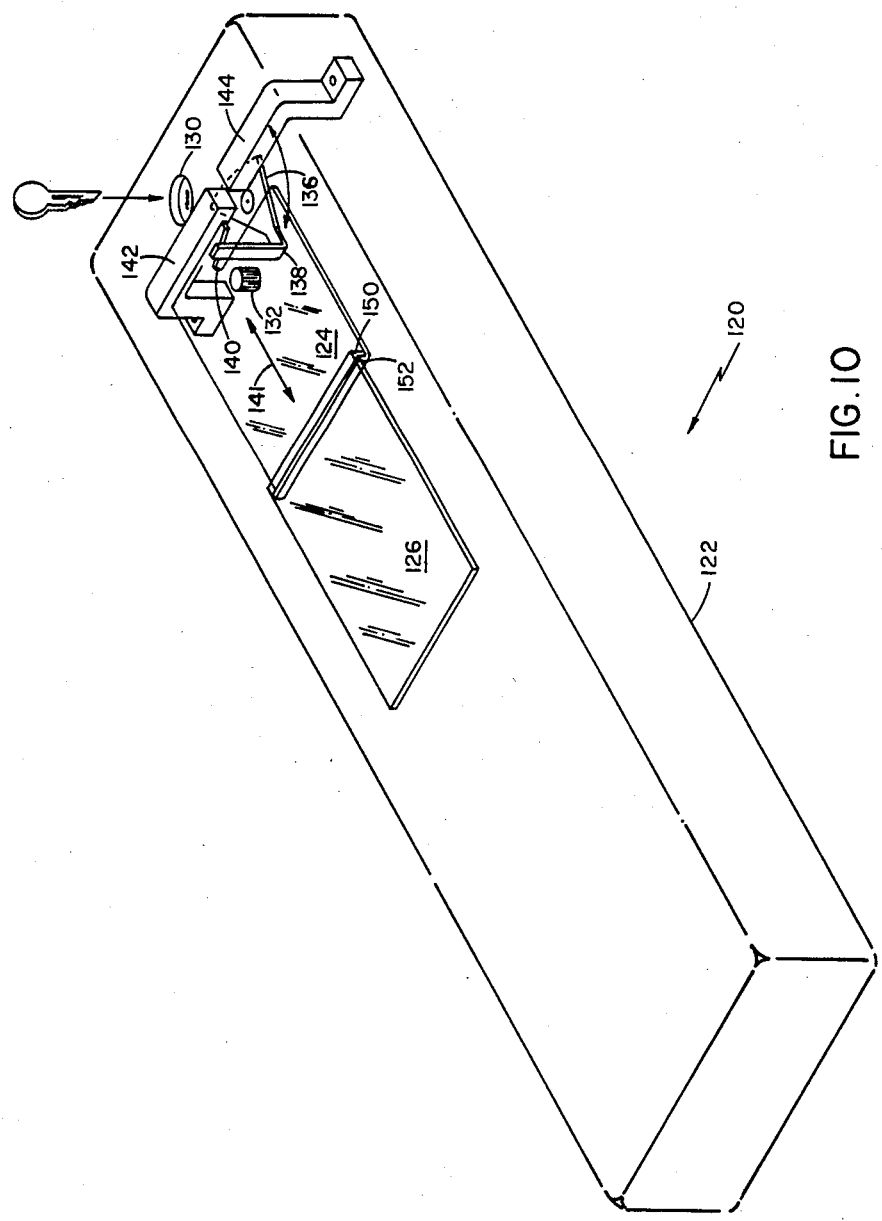
FIG. 10 is a perspective view of a portion of the locking mechanism of the cover of FIG. 9 in a second position with the cover in a first state.

Referring to FIG. 10, windows 124, 126 are supported by a frame (not shown) of grooved bars.

Lock 130 includes a shaft (not shown) and a cam 136; cam 136 has an L-shaped prong 138 which, when cover 120 is in the first state (lock 130 is in the second position), extends into a notch 140 in window 124, preventing it from being opened. Cam piece 136 also extends between the interior of the cabinet and two brackets 142, 144, secured to the cabinet, to lock the cover to the cabinet.

Figure 11:
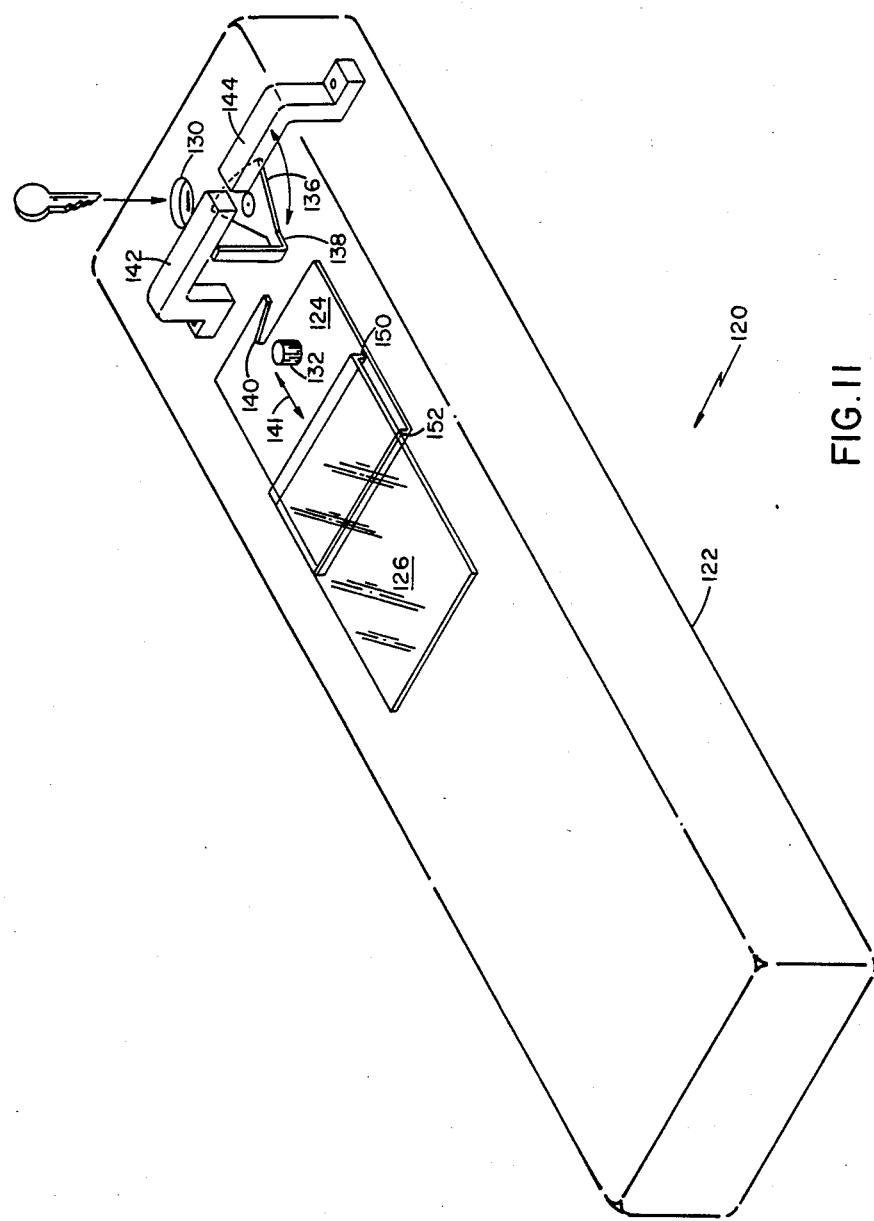
FIG. 11 is a perspective view like FIG. 10 but with the cover in a second state.

Referring to FIG. 11, when cover 120 is in the second state (lock 130 is again in the second position) the windows are open, i.e. they can be slid down and up, but are prevented from being fully closed by prong 138.

Figure 12:
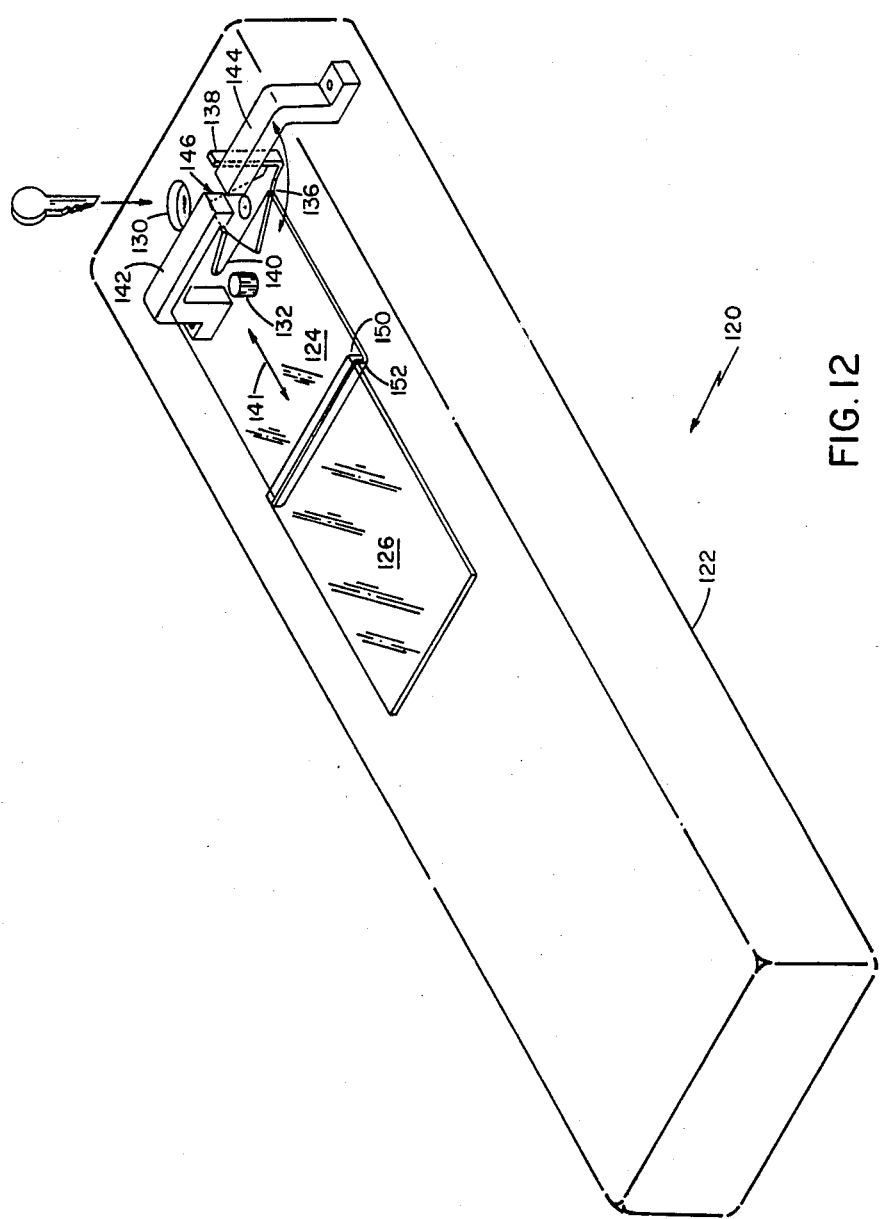
FIG. 12 is a perspective view like FIG. 10, but with the locking mechanism in another position.

Referring to FIG. 12, as lock 130 and cam 136 are rotated to the first position prong 138 is moved out of notch 140 and through a gap 146 between brackets 142, 144. In this position the cam is free of the brackets: cover 120 can be lifted away from the cabinet and windows 124 and 126 are free to slide up and down (arrows 141).

Referring again to FIG. 10, the windows, when open, are closed again by grasping and lifting handle 132. Window 124 will rise while window 126 remains stationary until a lip 150 on the lower edge of window 124 contacts a corresponding lip 152 on the upper edge of window 126, at which point window 126 will also begin to rise. The windows can be locked closed when handle 132 reaches the upper edge of opening 128 (FIG. 9). The interaction of lips 150, 152 also assures that when window 124 is locked, window 126 is likewise locked.

We claim:

1. A cover for a cabinet said cabinet having an exposed portion to which exposed portion access is to be controlled, comprising
    a detachable panel, to be attached to said cabinet, said panel having an opening corresponding to said exposed portion,
    a movable door arranged to obstruct access to said portion when said door is in a first location, and to permit access to said portion when said door is in a second location, and
    a locking mechanism both for locking said panel to said cabinet and for locking said door in said first location.

2. A cover for a cabinet said cabinet having a plurality of exposed portions to which exposed portions access is to be controlled, comprising
    a panel, to be attached to said cabinet, said panel having at least one opening corresponding to said exposed portions,
    a plurality of movable doors, each said door arranged to obstruct access to one of said portions when said door is in a first location and to permit access to said one portion when said door is in a second location, and
    a locking mechanism for locking each of said doors in either said first or said second location, and wherein when said locking mechanism is in a locked position, said cover has a first possible state in which only one of said doors is locked in its first location, and a second possible state in which at least another said door is locked in its first location.

3. A cover for a cabinet said cabinet having an exposed portion to which exposed portion access is to be controlled, comprising
    a panel, to be attached to said cabinet, said panel having an opening corresponding to said exposed portion,
    a plurality of movable doors arranged to obstruct access to said portion when said doors are in a first location and to permit access to said portion when said doors are in a second location, and when in said second location to lie in parallel overlapping planes adjacent and parallel to said panel in an area spaced away from said opening.

4. The cover of claim 1 wherein there are a plurality of said exposed portions and a plurality of said doors associated respectively with said portions, and said locking mechanism is arranged to lock all of said doors.

5. The cover of claim 3 wherein there are a plurality of said exposed portions, said doors are associated respectively with said portions, and further comprising a locking mechanism arranged to lock all of said doors.

6. The cover of claim 2 wherein when said cover is in said second state, all of said doors are locked in said first location.

7. The cover of claim 3 further comprising a locking mechanism for locking said doors in said first location and for locking said panel to said cabinet.

8. The cover of claim 1, 2, or 3 wherein said panel has three said openings, and said cover comprises
    three said doors corresponding respectively to said openings.

9. The cover of claim 1, 2, or 3 wherein each said exposed portion is on one side of said cabinet, and said panel is generally planar.

10. The cover of claim 1, 2, or 3 wherein each said door has a transparent window.

11. The cover of claim 1, 2, or 3 wherein each said door moves by sliding.

12. The cover of claim 1, or 2, wherein said locking mechanism comprises a key-operated mechanical rotary lock.

13. The cover of claim 2 wherein there are three said doors each having a said first location and a said second location, and, when said cover is in said first state, only one of said doors is locked in its first location, and when said cover is in said second state at least the other two said doors are locked in said first location.

14. The cover of claim 3 wherein said doors are arranged side-by-side in said first location and slide with respect to one another to reach said second location.

15. The cover of claim 3 wherein there are three said doors arranged in three quadrants of a rectangle and said area where said doors lie in said second location is the fourth quadrant of said rectangle.

16. The cover of claim 1 wherein said locking mechanism is arranged to lock said door in said second location.

17. The cover of claim 1 wherein when said locking mechanism is locked said cover has two selectable states, a first said state in which said panel is locked to said cabinet, and a second said state in which said panel is locked to said cabinet and at least said door is locked in said first location.

18. The cover of claim 17 wherein in said first state said door is locked in said second location.

19. The cover of claim 2 wherein said locking mechanism locks said panel to said cabinet.

20. The cover of claim 2 wherein when said cover is in said first or said second state said doors not locked in said first location are locked in said second location.

21. The cover of claim 19 wherein said locking mechanism comprises a key-operated mechanical rotary lock.

* * * * *

UNITED STATES PATENT AND TRADEMARK OFFICE
CERTIFICATE OF CORRECTION

PATENT NO. : 4,729,614

DATED : March 8, 1988

INVENTOR(S) : Nadler et al.

It is certified that error appears in the above-identified patent and that said Letters Patent is hereby corrected as shown below:

Column 2, line 26, --second-- is inserted before "position".

Column 2, line 36, --,-- is inserted after "FIG. 10".

Column 3, line 16, "FIG. 1" is changed to --(FIG. 1)--.

Signed and Sealed this

Sixth Day of March, 1990

Attest:

JEFFREY M. SAMUELS

Attesting Officer

Acting Commissioner of Patents and Trademarks